(12) United States Patent
Kekäläinen

(10) Patent No.: US 9,163,974 B1
(45) Date of Patent: Oct. 20, 2015

(54) WIRELESS GAUGE APPARATUS AND MANUFACTURING METHOD THEREOF

(71) Applicant: Enevo Oy, Espoo (FI)

(72) Inventor: Fredrik Kekäläinen, Espoo (FI)

(73) Assignee: ENEVO OY, Espoo (FI)

( * ) Notice: Subject to any disclaimer, the term of this patent is extended or adjusted under 35 U.S.C. 154(b) by 0 days.

(21) Appl. No.: 14/567,514

(22) Filed: Dec. 11, 2014

(51) Int. Cl.
*G01F 23/284* (2006.01)
*H05K 5/06* (2006.01)

(52) U.S. Cl.
CPC .............. *G01F 23/284* (2013.01); *H05K 5/065* (2013.01)

(58) Field of Classification Search
CPC .......... G01F 23/00; G01F 3/226; H05K 5/065
USPC ........................................ 73/290 V; 343/872
See application file for complete search history.

(56) References Cited

U.S. PATENT DOCUMENTS

| | | | |
|---|---|---|---|
| 4,316,183 A * | 2/1982 | Palmer et al. ................. | 340/621 |
| 5,866,815 A * | 2/1999 | Schwald et al. ............. | 73/290 V |
| 6,008,770 A * | 12/1999 | Sugawara ..................... | 343/767 |
| 6,052,097 A * | 4/2000 | Duncan et al. ................ | 343/788 |
| 6,075,500 A * | 6/2000 | Kurz et al. ..................... | 343/895 |
| 2002/0018018 A1* | 2/2002 | Fathy et al. ............. | 343/700 MS |
| 2004/0007061 A1* | 1/2004 | Forgue ......................... | 73/290 V |
| 2005/0122270 A1* | 6/2005 | Yano et al. ..................... | 343/718 |
| 2006/0270940 A1* | 11/2006 | Tsukashima et al. ......... | 600/529 |
| 2006/0272402 A1* | 12/2006 | Yin et al. ..................... | 73/146.8 |
| 2007/0115191 A1* | 5/2007 | Hashiguchi et al. .......... | 343/713 |
| 2007/0285324 A1* | 12/2007 | Waterhouse et al. ......... | 343/718 |
| 2009/0108989 A1* | 4/2009 | Sinclair ........................ | 340/5.62 |
| 2009/0145656 A1* | 6/2009 | Tschudin ...................... | 174/521 |
| 2010/0268219 A1* | 10/2010 | Ormsby et al. ................ | 606/33 |
| 2013/0016021 A1* | 1/2013 | Blair ............................. | 343/720 |

* cited by examiner

*Primary Examiner* — Lisa Caputo
*Assistant Examiner* — Philip Cotey
(74) *Attorney, Agent, or Firm* — Ziegler IP Law Group, LLC

(57) ABSTRACT

Disclosed is a wireless gauge apparatus and manufacturing method thereof. The wireless gauge apparatus comprises a printed circuit board comprising a wireless transceiver and at least one sensor, a power source electrically coupled with the printed circuit board, an antenna electrically coupled with the wireless transceiver and a casing encasing the printed circuit board, the power source and the antenna. The casing is made of polyurethane having a density of 0.8-1.2 $g/cm^3$. The antenna is surrounded by a protective layer having a thickness of 4-8 mm, a density of at most 50 $kg/m^3$ and a dielectric constant of 1-2.7.

13 Claims, 4 Drawing Sheets

WIRELESS GAUGE APPARATUS AND MANUFACTURING METHOD THEREOF

TECHNICAL FIELD

The present disclosure relates generally to a wireless gauge apparatus and manufacturing method thereof; and more specifically, to a wireless gauge apparatus having a robust construction and improved wireless communication as well as a manufacturing method thereof.

BACKGROUND

A wireless network consisting of spatially distributed wireless gauge apparatuses to monitor and determine physical or environmental conditions around the wireless gauge apparatuses is well known in the art. One such example includes use of a wireless gauge apparatus in conjunction with a garbage container for determining a fill level or a fill rate of the waste container. Generally, such gauges are subjected to harsh environment, for example, temperature changes, physical shocks, moisture, gases and chemicals. For example, an ambient temperature of a garbage container in areas like middle-east can vary from close to 100° C. in daytime to 0° C. during night. Further, waste or trash collected in such garbage container can be organic material, which decomposes and produces gases, such as methane and carbon dioxide. Also, waste can contain solvents, such as paint and other materials, which can evaporate and cause corrosion. Moreover, a garbage container may be subjected to a physical stress in terms of acceleration/shocks up to tens of G. Additionally, in some instances the gauge may be subjected to fire emergency and in such instances it would be desirable that the gauge should work for at least few minutes when exposed to direct fire or should work for about half an hour when exposed to heat, about 50° C., being thus capable of triggering an alarm and also fulfilling specific regulations.

In order to address the above issues, a gauge typically includes a plastic housing enclosing the electronic elements thereof. For example, the gauge may be casted with a suitable plastic material to substantially enclose the electronic elements and for shielding the gauge from above mentioned harsh environment. Primarily, such gauges are required to operate wirelessly and thus need to have a well-functioning radio unit, which generally operates on cellular network standards. In such instance, an antenna of such gauge needs to work effectively since the gauge is a battery powered device and is expected to have a long battery powered life. However, the robustness requirement (i.e. the plastic housing) for such gauges prevent utilization of an external antenna construction, i.e. the antenna is required to be arranged inside the housing. The plastic housing enclosing the antenna dramatically decreases effectiveness of the antenna. For example, such an antenna leads to increased power need or consumption for a transmitter of the gauge while sending signals. Also, such an antenna reduces sensitivity for a receiver of the gauge while receiving the signals and consequently reduced operation time.

Therefore, in light of the foregoing discussion, there exists a need to overcome the aforementioned drawbacks of a wireless gauge apparatus of having a robust construction and improved wireless communication.

SUMMARY

The present disclosure seeks to provide a wireless gauge apparatus that at least partially solves the above-mentioned problems.

The present disclosure also seeks to provide a method of manufacturing a wireless gauge apparatus.

In one aspect, an embodiment of the present disclosure provides a wireless gauge apparatus comprising:
- a printed circuit board comprising a wireless transceiver and at least one sensor;
- a power source electrically coupled with the printed circuit board;
- an antenna electrically coupled with the wireless transceiver; and
- a casing encasing the printed circuit board, the power source and the antenna, which casing is made of polyurethane having a density of 0.8-1.2 $g/cm^3$, wherein the antenna is surrounded by a protective layer having a thickness of 4-8 mm, a density of at most 50 $kg/m^3$ and a dielectric constant of 1-2.7.

In another aspect, an embodiment of the present disclosure provides a method of manufacturing a wireless gauge apparatus. The method comprises steps of:
- arranging the protective layer around the antenna;
- arranging the printed circuit board, the power source and the antenna on a support structure in a mould;
- filling the mould with polyurethane resin;
- allowing the polyurethane resin to harden;
- removing the mould;
- removing the support structure; and
- filling a space left by the support structure with polyurethane resin.

Embodiments of the present disclosure substantially eliminate or at least partially address the aforementioned problems in the prior art, and provides a wireless gauge apparatus having a robust construction and improved wireless communication.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
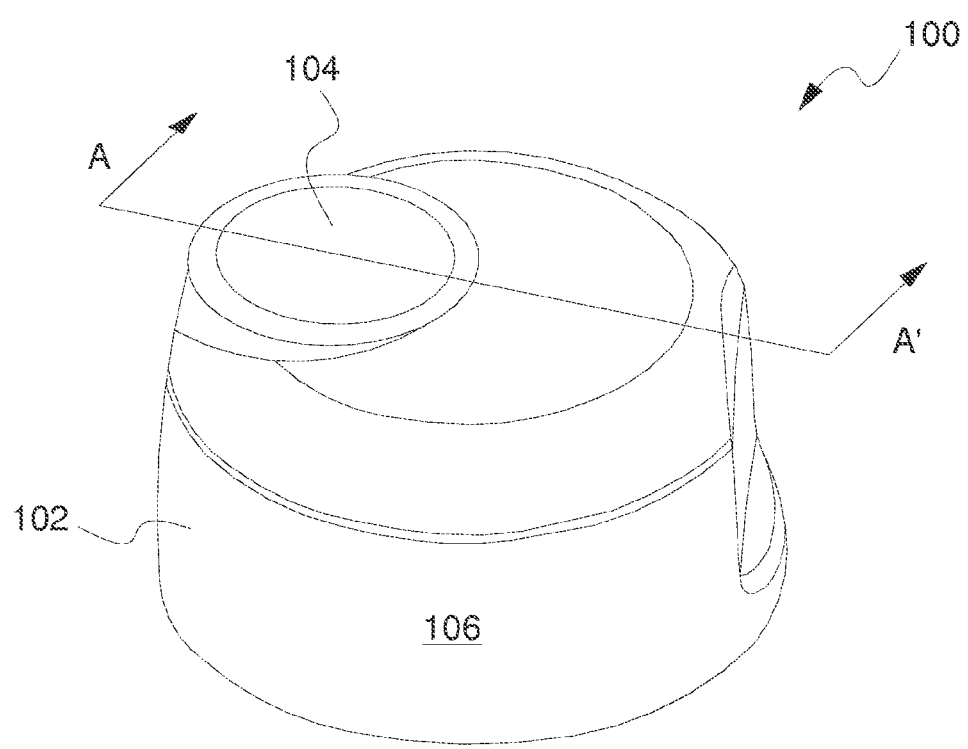
FIG. 1 is a perspective view of a wireless gauge apparatus, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides a wireless gauge apparatus comprising:
- a printed circuit board comprising a wireless transceiver and at least one sensor;
- a power source electrically coupled with the printed circuit board;
- an antenna electrically coupled with the wireless transceiver; and
- a casing encasing the printed circuit board, the power source and the antenna, which casing is made of polyurethane having a density of 0.8-1.2 g/cm$^3$, wherein the antenna is surrounded by a protective layer having a thickness of 4-8 mm, a density of at most 50 kg/m$^3$ and a dielectric constant of 1-2.7.

In an embodiment, the printed circuit board (PCB) is made of standard FR4 material. "FR" stands for "flame retardant", and denotes that safety of flammability of FR4 is in compliance with the flammability standard. The FR4 material is created from the constituent materials (epoxy resin, woven glass fabric reinforcement, brominated flame retardant, etc). Alternatively, the PCB may be made of other suitable material such as ceramic-filled hydrocarbon with woven glass, and the like. The PCB is further configured have any suitable shape such as a rectangular, a circular or a polygonal shape.

The PCB is electrically (operatively) mounted or connected with various electronic components and the power source. According to an embodiment, the various electronic components comprises the at least one sensors, the wireless transceiver, a microcontroller, memory and like. It is to be understood that the various electronic components primarily encompass all electronic components that are required for an operation of a wireless gauge, such as the wireless gauge apparatus of the present disclosure.

According to an embodiment, the various electronic components (the at least one sensors, the wireless transceiver, the microcontroller and the like) are electrically mounted or connected to the PCB, for example, with the help of reflow soldering technique.

According to an embodiment, the at least one sensor is a fill level sensor or a fill rate sensor operable to determine a fill level or a fill rate of the garbage container. For example, the sensor can be selected from the group consisting of ultrasonic sensor, infrared sensor, pressure sensor, weight sensor, ultra wideband radar sensor, CCD camera sensor and laser sensor.

According to another embodiment, the wireless gauge apparatus of the present disclosure also comprises other sensors selected from the group consisting of accelerometer, humidity sensor, gas sensor, ambient light sensor, temperature sensor and the like.

The wireless transceiver of the present disclosure includes a transmitter and a receiver to send and receive wireless signals. In an embodiment the wireless transceiver includes a cellular transceiver operable on cellular standards. Also, the wireless transceiver can include a modem to receive and transmit the wireless signals.

According to an embodiment, the microcontroller of the present disclosure is embedded with memory for a program data and data storage. The program data includes instructions defining a pattern of working of the wireless gauge apparatus. For example, the program data includes instructions for defining a pattern for sensors functioning, such as monitoring a fill level or fill rate of a garbage container, and transmitting the sensed data based on some predefined criteria.

According to an embodiment, the power source is an industrial grade Li-Ion battery. The power source may naturally be any other kind of suitable power source, such as Lithium-thionyl-chloride battery. The power source provides required electrical power to the various electronic components and to the antenna for operation of the wireless gauge apparatus.

The antenna of the present disclosure is electrically coupled to the wireless transceiver. According to an embodiment, the antenna of the present disclosure is a trace antenna. Specifically, the antenna is defined on a portion of the PCB. For example, the antenna includes the portion of the PCB as a substrate on which a metallic trace is printed (defining an antenna topology). Alternatively, the antenna can be a separate PCB (for example made of FR-4 material) and operatively and structurally coupled to the main PCB of the wireless gauge apparatus. Further, the antenna is configured to be operable on standard cellular networks, such as Global System for Mobile communication (GSM), Code Division Multiple Access (CDMA), General packet radio service (GPRS), local area wireless networks (WiFi, WLAN etc.), Bluetooth or similar.

According to an embodiment, the antenna may be configured to have a shape of substantially flat dome structure. In an example, the antenna may be configured to have the following dimensions, i.e. a length of about 65 mm, a height of about 28 mm and a thickness of about 1 mm to 1.6 mm.

As mentioned above, the antenna of the present disclosure is surrounded with the protective layer having the thickness of about 4-8 mm. The thickness can for example be of about 5-7 mm or about 4-6 mm or about 6-8 mm. Further, it is to be understood that the protective layer should be configured to have a shape that conforms to the shape of the antenna. For example, the protective layer is also configured to have the shape of substantially flat structure, with the following dimensions, i.e. a length of about 65 mm, a height of about 28 mm and a thickness of about 6 mm (shown in FIG. 4A-4B). The protective layer can be a single layer surrounding the entire antenna or can be a pair of protective layers coupled to both sides of the antenna. Moreover, the protective layer may be attached to each side of the PCB using a suitable adhesive or glue. According to an embodiment, the antenna is thus a trace antenna arranged on the printed circuit board and the protective layer is arranged on both sides of the printed circuit board.

According to an embodiment, the protective layer is made of a closed cell plastic material. The closed cell plastic material is preferably a lightweight rigid plastic material which is immune to rain and sunlight. In an example, the closed cell plastic material is selected from the group consisting of polyethylene, polypropylene, polyurethane and polystyrene.

The protective layer, as mentioned above, has a density of at most 50 kg/m³. Specifically, the protective layer has a density, i.e. ratio of mass to volume of the closed cell plastic material, of at most 50 kg/m³. The value 50 kg/m³ indicates that a cube made of the closed cell plastic material has a volume of 1 m³ and at most a mass of 50 kg. Therefore, the protective layer (having dimensions such as the length of about 65 mm, the height of about 28 mm and the thickness of about 4-8 mm) can be a portion or cutout from such cube (made of closed cell plastic material and having 1 m³ volume and at most mass of 50 kg). The density of the protective layer is preferably at least 10 kg/m³.

Further, as mentioned above, the protective layer has a dielectric constant of 1-2.7. The dielectric constant, also called relative permittivity is the ratio of the permittivity of a substance to the permittivity of free space. It is an expression of the extent to which a material concentrates electric flux, and is the electrical equivalent of relative magnetic permeability. In an example, the dielectric constant of the protective layer is between 1 and 2.4. In another example, the dielectric constant of the casing is 4-7.

According to an embodiment, the protective layer of the present disclosure may be constructed in a different manner while having the properties disclosed above. In an example, the protective layer is made of a plastic material consisting of two sheets with gas entrapped in between the sheets. Alternatively, the protective layer is constructed to be a rigid protective casing filled with gas.

Figure 2:
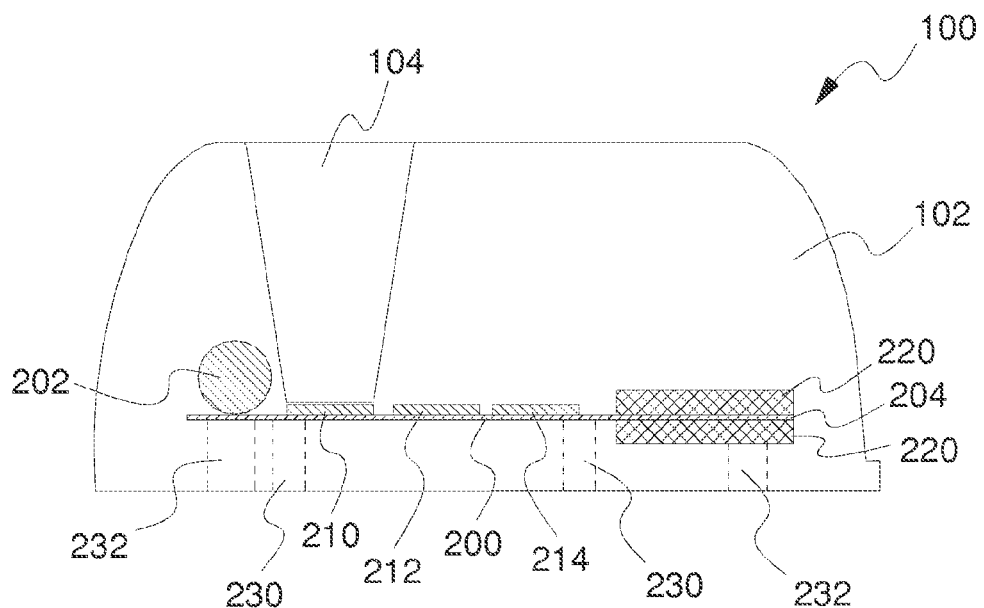
FIG. 2 is a sectional view of the wireless gauge apparatus of FIG. 1 along a sectional line A-A'.

According to an embodiment of the present disclosure, the casing is configured to have substantially hemispherical frustum shape (best shown in FIGS. 1-2). In an example, the casing can be a solid casing which provides robustness to the wireless gauge apparatus. For example, a size of the casing is such that a distance from the printed circuit board, the power source and the antenna to an outer surface of the casing is at least 10 mm. When an ultrasound proximity sensor (also called ultrasound sensor in this description) is used, the sensor is uncovered by the casing.

Thus, according to an embodiment, the at least one sensor is uncovered by the casing. Specifically, the casing includes an opening extending along a height (i.e. from a top portion towards a bottom portion thereof) and the opening end at the at least once sensor, such that the at least one sensor is visible and accessible through the opening.

As mentioned above, the casing of the present disclosure is made of polyurethane having a density of 0.8-1.2 g/cm³ (i.e. 800-1200 kg/m³).

In another aspect, an embodiment of the present disclosure provides a method for manufacturing the wireless gauge apparatus. The method comprises steps of:
arranging the protective layer around the antenna;
arranging the printed circuit board, the power source and the antenna on a support structure in a mould;
filling the mould with polyurethane;
allowing the polyurethane resin to harden;
removing the mould;
removing the support structure; and
filling a space left by the support structure with polyurethane resin.

In an example, the protective layer is glued around the antenna, i.e. the protective layer is glued on the each (top or bottom) side of the antenna's PCB portion.

According to an embodiment, the support structure can be inserts used for holding the PCB along with the power source and the antenna within the mould. As mentioned above, the casing can be configured to have substantially hemispherical frustum shape; therefore the mould can be also configured to have a hemispherical frustum shape. In this case, the mould would include a hemispherical frustum shape cavity along with a hollow structure (provided to uncover the at least one sensor when this is required).

According to an embodiment, where an ultrasound sensor is used, when the PCB, the power source and the antenna are arranged on the support structure, the at least one sensor present on the PCB is positioned next to the hollow structure (having frustoconical shape) of the mould. Specifically, the mould includes the hollow structure adapted to be placed next to the least one sensor such that the opening can be formed on top of the least one sensor present, when the casing is formed by filling the mould with the polyurethane resin.

According to an embodiment, the polyurethane resin is traditionally and most commonly formed by reacting a diisocyanate or a polyisocyanate with a polyol. Both the isocyanates and polyols used to make the polyurethane contain on average two or more functional groups per molecule. Typically, manufacturing principle includes providing the liquid isocyanate and resin blend at a specified stoichiometric ratio and mixing them together until a homogeneous blend (polyurethane resin) is obtained.

In an example, the polyurethane resin is poured into the mould in a bottom-up manner with the mould in an oblique position. Further, prior to pouring the polyurethane resin into the mould certain measures are taken, such as, the hollow structure of the mould is arranged next to the at least one sensor.

Thereafter, the polyurethane resin is allowed to harden in the mould for a certain time period for forming a consistent and a robust casing around the PCB, the power source and the antenna. Further, the mould is removed, i.e. the casing encasing the PCB, the power source and the antenna is taken out of the mould. Moreover, the support structure is removed and a space left by the support structure is again filled with the polyurethane resin. This results in a solid robust casing around the PCB, the power source and the antenna, which is permanent in nature and cannot be opened. This precludes tampering the wireless gauge apparatus of the present disclosure.

The wireless gauge apparatus of the present disclosure also provides improved wireless communication along with the robust construction thereof. For example, the antenna's construction and various properties (such as density and dielectric constant) of the materials used in the manufacturing of the wireless gauge apparatus provides improved wireless communication.

According to an embodiment, an improved wireless communication for the wireless gauge apparatus is determined with respect to an efficiency of the antenna for performing wireless communication.

Referring now to below Table 1, an efficiency of the antenna (having the protective layer) of the wireless gauge apparatus of the present disclosure is shown to be compared with an efficiency of a conventional antenna (without such protective layer). Further, as shown in Table 1, the efficiency of the antenna is calculated when the antenna is operated on a standard cellular network, such as GPRS850 MHz (frequency band), ch192. The Table 1 also shows various other aspects of the antenna taken into consideration while calculating the efficiency thereof. For example, Table 1 includes EUT ID, i.e. equipment under test ID (which can be an ID of an antenna or an ID of wireless gauge apparatus having an antenna) and MAX level (dBm) i.e. maximum power ratio referenced to one milliwatt. The Table 1 also includes others aspects such as, Turntable aspect of the antenna (such as Angle and Tilt) and Antenna polarisation.

TABLE 1

GPRS850, ch192

| EUT ID | MAX level (dBm) | Turntable Angle | Tilt | Antenna polari- sation | |
|---|---|---|---|---|---|
| 924 | 16.17 | 138 | 0 | HOR | Conventional antenna without ETA-foam |
| 1203 | 18.30 | 140 | 0 | HOR | Conventional antenna without ETA-foam |
| 2361 | 24.06 | 129 | 90 | VER | Antenna with ETA-foam |
| 2362 | 23.30 | 129 | 90 | VER | Antenna with ETA-foam |
| 1694 | 20.42 | 166 | 0 | HOR | Conventional antenna with ETA-foam |

As shown, an EUT 924 (a conventional antenna without the protective layer), in GPRS850 MHz frequency band, which is polarized horizontally and having a turntable angle 138° and a tilt 0° is operable (send or receive wireless signals) to have a maximum power ratio of about 16.17 dBm. Similarly, an EUT 1203 (a conventional antenna without the protective layer), in GPRS850 MHz frequency band, which is polarized horizontally and having a turntable angle 140° and a tilt 0° is operable to have a maximum power ratio of about 18.30 dBm. However, an EUT 2361 (an antenna having the protective layer based on the present disclosure), in GPRS850 MHz frequency band, which is polarized vertically and having a turntable angle 129° and a tilt 90° is operable to have a maximum power ratio of about 24.06 dBm. Similarly, an EUT 2362 (an antenna having the protective layer), in GPRS850 MHz frequency band, which is polarized vertically and having a turntable angle 129° and tilt 90° is operable to have a maximum power ratio of about 23.30 dBm. The comparison of the maximum power ratios of the EUTs 924 and 1203 with respect to the EUTs 2361 and 2362 clearly depicts the EUTs 2361 and 2362 have improved antenna efficiencies. For example, the maximum power ratios are show to increase in a range of 5 to 8 dBm. Additionally, when an EUT 1694 (a conventional antenna having the protective layer), in GPRS850 MHz frequency band, which is polarized horizontally and having a turntable angle 166° and a tilt 0° is operable to have a maximum power ratio of about 20.42 dBm, which is also better than the maximum power ratio of the EUTs 924 and 1203 (conventional antennas).

Referring now to below Table 2, the efficiency of the antenna is calculated when the antenna is operated on another standard cellular network, such as GSM 1900 MHz, ch663.

TABLE 2

GSM1900, ch663

| EUT ID | MAX level (dBm) | Turntable Angle | Tilt | Antenna polari- sation | |
|---|---|---|---|---|---|
| 924 | 20.49 | 158 | 0 | HOR | Conventional antenna without ETA-foam |
| 1203 | 19.62 | 159 | 0 | HOR | Conventional antenna without ETA-foam |

TABLE 2-continued

GSM1900, ch663

| EUT ID | MAX level (dBm) | Turntable Angle | Tilt | Antenna polari- sation | |
|---|---|---|---|---|---|
| 2361 | 25.43 | 199 | 90 | VER | Antenna with ETA-foam |
| 2362 | 24.97 | 258 | 90 | VER | Antenna with ETA-foam |
| 1694 | 25.28 | 174 | 0 | HOR | Conventional antenna with ETA-foam |

As shown, an EUT 924 (a conventional antenna without the protective layer), in GSM1900 MHz frequency band, which is polarized horizontally and having a turntable angle 158° and a tilt 0° is operable to have a maximum power ratio of about 20.49 dBm. Similarly, an EUT 1203 (a conventional antenna without the protective layer), in GSM1900 MHz frequency band, which is polarized horizontally and having a turntable angle 159° and a tilt 0° is operable to have a maximum power ratio of about 19.62 dBm. However, an EUT 2361 (an antenna having the protective layer based on present disclosure), in GSM1900 MHz frequency band, which is polarized vertically and having a turntable angle 199° and a tilt 90° is operable to have a maximum power ratio of about 25.43 dBm. Similarly, an EUT 2362 (an antenna having the protective layer), in GSM1900 frequency band, which is polarized vertically and having a turntable angle 258° and a tilt 45° is operable to have a maximum power ratio of about 24.97 dBm. The comparison of the maximum power ratios of the EUTs 924 and 1203 with respect to the EUTs 2361 and 2362 clearly depicts the EUTs 2361 and 2362 have improved antenna efficiencies. For example, the maximum power ratios are show to increase in a range of 4 to 6 dBm. Additionally, an EUT 1694 (a conventional antenna having the protective layer), in GSM1900 frequency band, which is polarized horizontally and having a turntable angle 174° and a tilt 0° is operable to have a maximum power ratio of about 25.28 dBm, which is also better than maximum power ratio of the EUTs 924 and 1203 (conventional antennas).

Based on above examples the efficiency of an antenna with protective layer improves with an average value of about 3 dBm in 900 MHz frequency band and 6 dBm in 1900 MHz frequency band. Therefore, such improvements, for example, the improvement of 3 dB results in 50% reduction in power requirement for transmitting signals, and 100% improvement in reception sensitivity for the wireless transceiver (electrically coupled to the antenna).

The present disclosure provides a wireless gauge apparatus having a robust construction and improved wireless communication. The wireless gauge apparatus can be suitably used in harsh environment, such as temperature changes, physical shocks, moisture, gases and chemicals. Further, the wireless gauge apparatus, particularly, the antenna's construction and various properties of material used in the manufacturing of the wireless gauge apparatus provide improved wireless communication. Moreover, the wireless gauge apparatus of the present disclosure can have increase battery powered life due to such improved wireless communication. The application of such wireless gauge apparatus can be found in various fields (apart from the garbage containers), such as to remotely monitor and determine physical or environmental conditions (such as acceleration, humidity, gas, light, temperature and the like).

DETAILED DESCRIPTION OF THE DRAWINGS

Referring to FIG. 1, illustrated is a perspective view of a wireless gauge apparatus 100, in accordance with an embodiment of the present disclosure. The wireless gauge apparatus 100 includes a casing 102 having a substantially hemispherical frustum shape. In this embodiment, the casing 102 includes an opening 104 extending along a height (i.e. from a top portion towards a bottom portion thereof), best shown in FIG. 2. The casing 102 also includes an outer surface 106.

Referring now to FIG. 2, illustrated is a sectional view of the wireless gauge apparatus 100 of FIG. 1 along a sectional line A-A'. As shown, the casing 102 encases a printed circuit board (PCB) 200, a power source 202 and an antenna 204. The PCB 200 is electrically (operatively) mounted or connected with various electronic components, which include but are not limited to at least one sensor 210 (primarily a fill rate sensor such as an ultrasonic sensor), a microcontroller 212 and a wireless transceiver 214. The PCB 200 is also operatively connected to the power source 200 and the antenna 204. The antenna 204 is electrically coupled with the wireless transceiver 214. The antenna 204 is surrounded by a protective layer 220.

The PCB 200, the power source 202 and the antenna 204 are supported by a support structure, such as support struts 230, within the casing 102. Specifically, the support struts 230 are used to support the PCB 200, the power source 202 and the antenna 204 within a mould during a manufacturing (casting) of the casing 102, and once the casing 102 is prepared (casted) the space left by the support struts 230 is filled with polyurethane resin for closing the space. The casing 102 also includes attachment points 232, such as nut inserts, to provide simple attachment into target structure.

Figure 3:
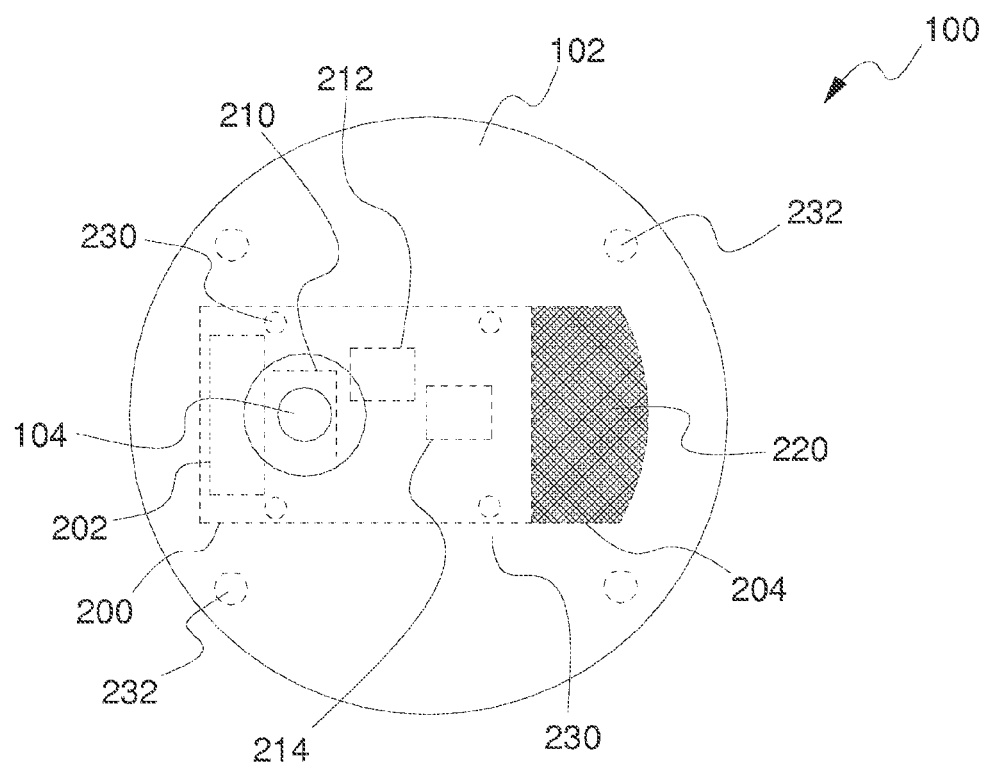
FIG. 3 is a top view of the wireless gauge apparatus of FIG. 1.

Referring now to FIG. 3, illustrated is a top view of the wireless gauge apparatus 100 of FIG. 1. As shown, the at least one sensor 210 is uncovered by the casing 102, i.e. the at least one sensor 210 is visible or accessible through the opening 104. FIG. 3 also illustrates respective components of the wireless gauge apparatus 100 as shown in the FIG. 2.

Figure 4A:
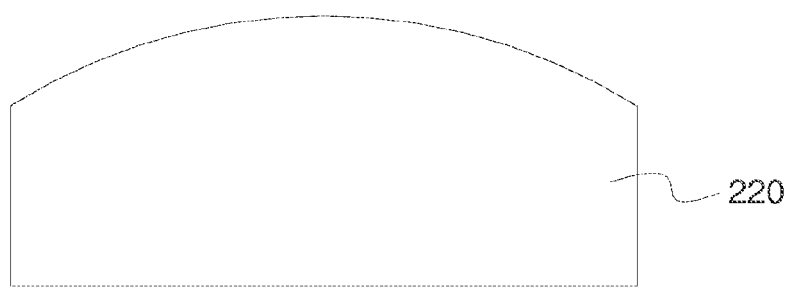
FIGS. 4A and 4B are top and side views, respectively, of a protective layer adapted to surround an antenna of the wireless gauge apparatus of FIG. 2.
Figure 4B:

Referring now to FIGS. 4A and 4B, illustrated are top and side views of the protective layer 220, respectively. As shown, the protective layer 220 is configured to have a shape of substantially flat dome structure. Specifically, the protective layer 220 is configured to have a shape such that the protective layer 220 appropriately conforms to or surrounds the antenna 204 (or antenna topology).

Figure 5:
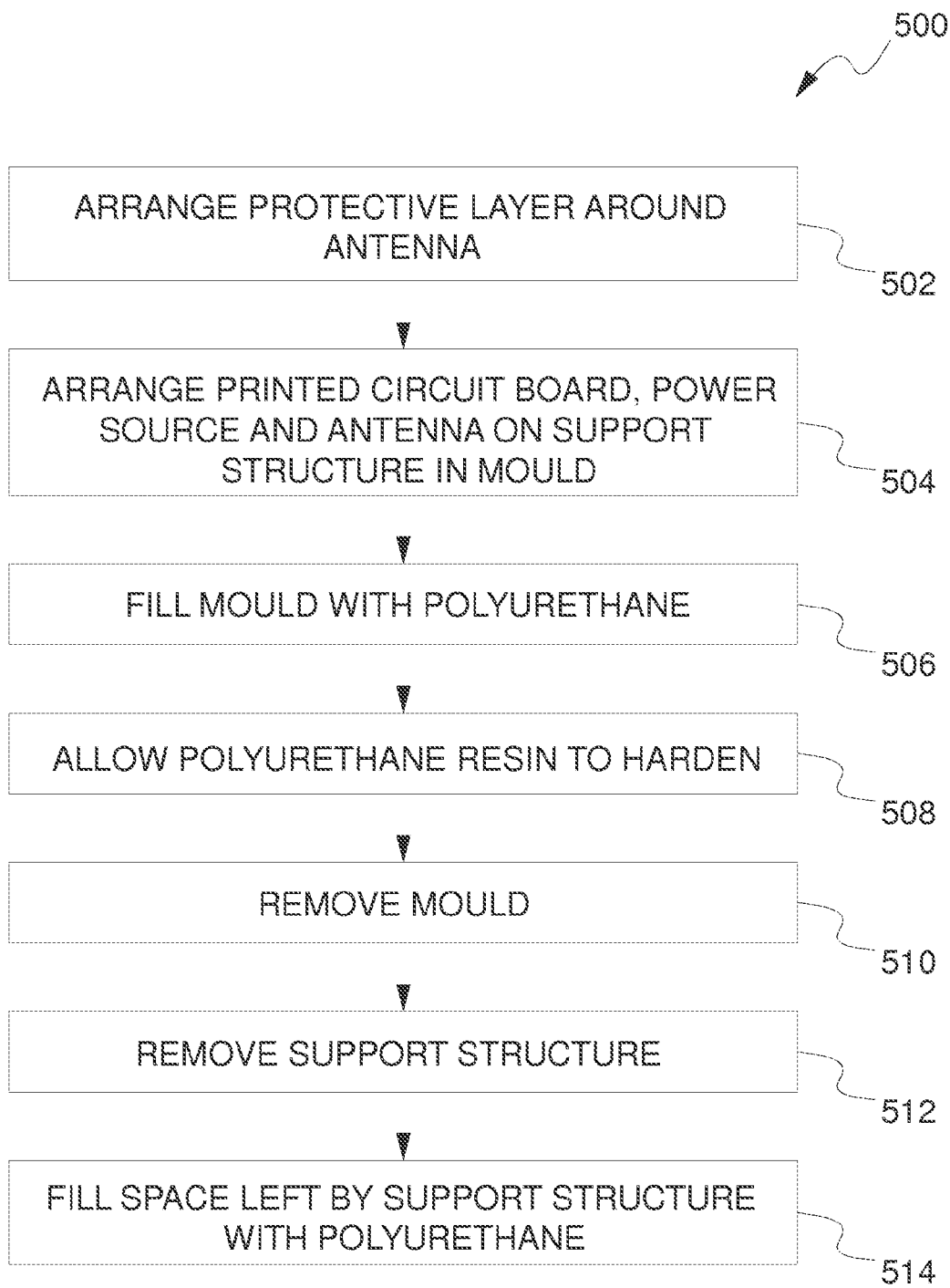
FIG. 5 is an illustration of steps of a method for manufacturing a wireless gauge apparatus, in accordance with an embodiment of the present disclosure.

Referring now to FIG. 5, illustrated are steps of a method 500 for manufacturing a wireless gauge apparatus, in accordance with an embodiment of the present disclosure. Specifically, the method 500 illustrates the steps of manufacturing the wireless gauge apparatus 100, explained in conjunction with the FIGS. 1-3.

At step 502, the protective layer is arranged around the antenna.

At step 504, the printed circuit board, the power source and the antenna are arranged on a support structure in a mould.

At step 506, the mould is filled with polyurethane resin.

At step 508, the polyurethane resin inside the mould is allowed to harden.

At step 510, the mould is removed. The removal of the mould forms a casing (hardened polyurethane) encasing the printed circuit board, the power source and the antenna therein.

At step 512, the support structure is removed.

At step 514, a space left by the support structure is filled with polyurethane resin.

The steps 502 to 514 are only illustrative and other alternatives can also be provided where one or more steps are added, one or more steps are removed, or one or more steps are provided in a different sequence without departing from the scope of the claims herein. For example, the method 500 may include gluing the protective layer around the antenna.

Figure 6:
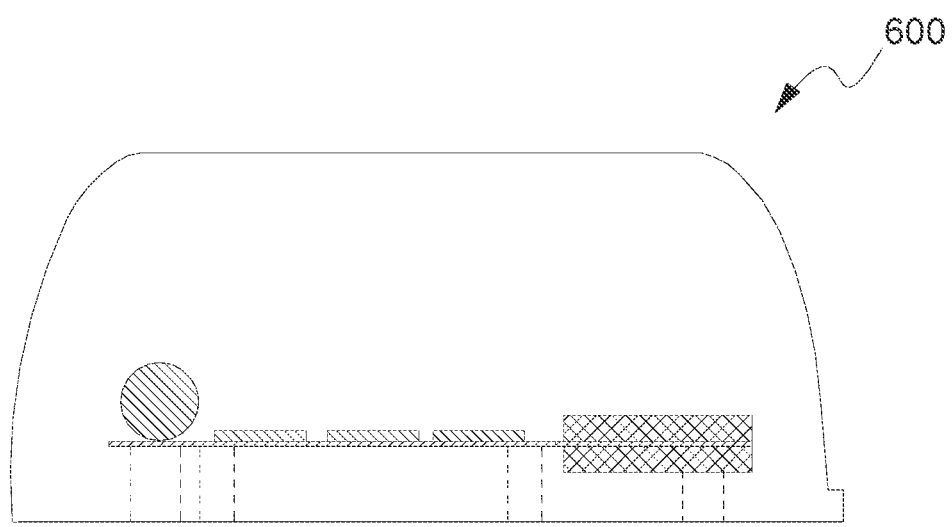
FIG. 6 is a perspective view of a wireless gauge apparatus, in accordance with another embodiment of the present disclosure.

FIG. 6 is a perspective view of a wireless gauge apparatus 600, in accordance with another embodiment of the present disclosure. In this embodiment, the at least one sensor is selected to be such that no opening of the casing is required, i.e. for example an ultra wideband radar sensor is used.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A wireless gauge apparatus comprising:
    a printed circuit board comprising a wireless transceiver and at least one sensor, the printed circuit board having a first side and a second side;
    a power source electrically coupled with the printed circuit board;
    an antenna electrically coupled with the wireless transceiver and mounted on the first side of the printed circuit board; and
    a casing encasing the printed circuit board, the power source and the antenna, which casing is made of polyurethane having a density of 0.8-1.2 g/cm$^3$,
    a protective layer disposed within the casing that is molded around and encases the antenna, the protective layer extending only around the antenna on the first side of the printed circuit board and on a corresponding portion of the second side of the second surface of the printed circuit board, the protective layer conforming to a shape of the antenna on the first side of the printed circuit board, the protective layer having a thickness of 4-8 mm, a density of at most 50 kg/m$^3$ and a dielectric constant of 1-2.7.

2. A wireless gauge apparatus according to claim 1, wherein the protective layer is made of a closed cell plastic material.

3. A wireless gauge apparatus according to claim 2, wherein the closed cell plastic material is selected from the group consisting of polyethylene, polypropylene, polyurethane and polystyrene.

4. A wireless gauge apparatus according to claim 1, wherein the protective layer is made of a plastic material consisting of two sheets with gas entrapped in between the sheets.

5. A wireless gauge apparatus according to claim 1, wherein the protective layer is a rigid protective casing filled with gas.

6. A wireless gauge apparatus according to claim 1, wherein the density of the protective layer is 10-50 kg/m$^3$.

7. A wireless gauge apparatus according to claim 1, wherein the dielectric constant of the protective layer is between 1 and 2.4.

8. A wireless gauge apparatus according to claim 1, wherein the antenna is a trace antenna, the trace antenna being disposed on the surface of printed circuit board and the wherein the protective layer extends only over the first surface of the printed circuit board corresponding to an area on which the trace antenna is disposed of the printed circuit board.

9. A wireless gauge apparatus according to claim 1, wherein the casing comprises colour pigments.

10. A wireless gauge apparatus according to claim 1, wherein a size of the casing is such that the distance from the printed circuit board, the power source and the antenna to an outer surface of the casing is at least 10 mm.

11. A wireless gauge apparatus according to claim 10, wherein the at least one sensor is uncovered by the casing.

12. The wireless gauge apparatus of claim 1, wherein the antenna is mounted flush with the first side of the printed circuit board.

13. The wireless gauge apparatus of claim 8, wherein the trace antenna is mounted flush on the first side of the printed circuit board.

\* \* \* \* \*